United States Patent
Lee

(10) Patent No.: US 7,623,110 B2
(45) Date of Patent: Nov. 24, 2009

(54) SYSTEMS FOR DISPLAYING IMAGES BY UTILIZING HORIZONTAL SHIFT REGISTER CIRCUIT FOR GENERATING OVERLAPPED OUTPUT SIGNALS

(75) Inventor: Ching-Hone Lee, Hsin-Chu (TW)

(73) Assignee: TPO Displays Corp. (TW)

( * ) Notice: Subject to any disclaimer, the term of this patent is extended or adjusted under 35 U.S.C. 154(b) by 573 days.

(21) Appl. No.: 11/649,948

(22) Filed: Jan. 5, 2007

(65) Prior Publication Data
US 2008/0165172 A1    Jul. 10, 2008

(51) Int. Cl.
G09G 3/36    (2006.01)
(52) U.S. Cl. .......................... 345/100; 345/87; 345/98; 327/208
(58) Field of Classification Search .......... 345/87–100; 327/100, 208, 210, 211, 333
See application file for complete search history.

(56) References Cited
U.S. PATENT DOCUMENTS

| | | | | |
|---|---|---|---|---|
| 6,064,246 | A | * | 5/2000 | Endo et al. .................. 327/202 |
| 6,075,386 | A | * | 6/2000 | Naffziger ..................... 326/98 |
| 6,157,228 | A | | 12/2000 | Yokoyama et al. |
| 7,420,536 | B2 | * | 9/2008 | Jang et al. .................... 345/100 |
| 2005/0195160 | A1 | * | 9/2005 | Tamura ...................... 345/156 |
| 2005/0264505 | A1 | * | 12/2005 | Kim ............................ 345/87 |
| 2006/0007212 | A1 | * | 1/2006 | Kimura et al. ............... 345/204 |
| 2006/0145954 | A1 | * | 7/2006 | Kubota et al. ................. 345/66 |
| 2006/0267911 | A1 | * | 11/2006 | Jang ........................... 345/100 |
| 2007/0075954 | A1 | * | 4/2007 | Oh et al. ....................... 345/92 |

* cited by examiner

Primary Examiner—Richard Hjerpe
Assistant Examiner—Kimnhung Nguyen
(74) Attorney, Agent, or Firm—Thomas, Kayden, Horstemeyer & Risley, LLP.

(57) ABSTRACT

Systems for displaying images are provided. An embodiment of such a system has a dynamic shift register. The dynamic shift register includes a first, second, third, fourth and fifth switching circuits and a level adjusting circuit. The first switching circuit controls if the first supply voltage is transmitted to a first node. When the first switching circuit is switched off, the level adjusting circuit drives a voltage level of the first node toward the second supply voltage. The second switching circuit controls if the first supply voltage is transmitted to a second node. The third switching circuit controls if the first input signal is transmitted to the second node. The fourth switching circuit controls if the first supply voltage is transmitted to the output terminal. The fifth switching circuit controls if the second input signal is transmitted to the output terminal.

18 Claims, 6 Drawing Sheets

SYSTEMS FOR DISPLAYING IMAGES BY UTILIZING HORIZONTAL SHIFT REGISTER CIRCUIT FOR GENERATING OVERLAPPED OUTPUT SIGNALS

BACKGROUND OF INVENTION

1. Field of the Invention

The present invention relates to displaying images, especially to systems for displaying images by utilizing a horizontal shift register circuit for generating overlapped output signals.

2. Description of the Prior Art

Generally, liquid crystal displays (LCDs) display images utilizing electric fields to control the light transmittance characteristics of liquid crystal material. Accordingly, LCDs include a liquid crystal display panel having liquid crystal cells arranged in a matrix pattern and driving circuits for driving the liquid crystal display panel.

Gate lines and data lines are arranged within the liquid crystal display panel such that their arrangement caused them to cross each other. Liquid crystal cells are arranged at crossings of the gate and data lines. Liquid crystal display panels include pixel electrodes and a common electrode that apply electric fields to each of the liquid crystal cells. Each pixel electrode is connected to a corresponding data line via source or drain terminals of a switching device such as a thin film transistor (TFT). A gate terminal of each of the thin film transistors is connected to a corresponding gate line.

Driving circuits include a gate driver and a data driver. The gate driver sequentially drives the liquid crystal cells on the liquid crystal display panel by sequentially applying a scanning signal to the gate lines. When the gate lines are supplied with the scanning signal, the data driver applies a video signal to respective ones of the data lines. Pictures are displayed by applying an electric field between pixel electrodes of each of the liquid crystal cells in the LCD panel and the common electrode. Electric fields are applied in accordance with inputted video signals.

Shift registers are the most frequently utilized devices to generate the scanning signal. U.S. Pat. No. 6,157,228 discloses a data line driving circuit that includes a shift register. This prior art shift register, compared to the conventional shift register, utilizes less inverters which result in less delay time and a better display quality of the LCD. However, the prior art shift register is implemented using a CMOS configuration. In a COMS manufacturing process more masks are required and therefore the throughput is low.

SUMMARY OF INVENTION

Systems for displaying images are provided. In this regard, an exemplary embodiment of such a system comprises a dynamic shift register having a first switching circuit, a level adjusting circuit, a second switching circuit, a third switching circuit, a fourth switching circuit, and a fifth switching circuit. The first switching circuit, which is coupled to a first input terminal of the dynamic shift register, an output terminal of the dynamic shift register, a first supply voltage, and a first node, controls if the first supply voltage is transmitted to the first node according to a first input signal received by the first input terminal and an output signal outputted from the output terminal. The level adjusting circuit is coupled to and located between the first node and a second supply voltage. When the first switching circuit is switched off, the level adjusting circuit is capable of driving a voltage level of the first node toward the second supply voltage. The second switching circuit, which is coupled to the first node, the first supply voltage, and a second node, controls if the first supply voltage is transmitted to the second node according to the voltage level of the first node. The third switching circuit, which is coupled to the first input signal and the second node, controls if the first input signal is transmitted to the second node according to the first input signal. The fourth switching circuit, which is coupled to the first node, the first supply voltage, and the output terminal, controls if the first supply voltage is transmitted to the output terminal according to the voltage level of the first node. The fifth switching circuit, which is coupled to a second input terminal of the dynamic shift register, the second node, and the output terminal, controls if the second input signal received by the second input terminal is transmitted to the output terminal according to a voltage level of the second node.

According to another embodiment of the claimed invention, a horizontal shift register (HSR) circuit for generating overlapped output signals is disclosed. The HSR circuit comprises a plurality of dynamic shift registers connected in a series, and each dynamic shift register comprises a first switching circuit, a level adjusting circuit, a second switching circuit, a third switching circuit, a fourth switching circuit, and a fifth switching circuit. The first switching circuit, which is coupled to a first input terminal of the dynamic shift register, an output terminal of the dynamic shift register, a first supply voltage and a first node, controls if the first supply voltage is transmitted to the first node according to a first input signal received by the first input terminal and an output signal outputted from the output terminal. The level adjusting circuit is coupled to and located between the first node and a second supply voltage. When the first switching circuit is switched off, the level adjusting circuit is capable of driving a voltage level of the first node toward the second supply voltage. The second switching circuit, which is coupled to the first node, the first supply voltage, and a second node, controls if the first supply voltage is transmitted to the second node according to the voltage level of the first node. The third switching circuit, which is coupled to the first input signal and the second node, controls if the first input signal is transmitted to the second node according to the first input signal. The fourth switching circuit, which is coupled to the first node, the first supply voltage, and the output terminal, controls if the first supply voltage is transmitted to the output terminal according to the voltage level of the first node. The fifth switching circuit, which is coupled to a second input terminal of the dynamic shift register, the second node, and the output terminal, controls if the second input signal received by the second input terminal is transmitted to the output terminal according to a voltage level of the second node. For each of the dynamic shift registers, except an initial dynamic shift register, the first input terminal is coupled to an output terminal of a preceding dynamic shift register.

Consequently, the dynamic shift register disclosed in the present invention utilizes single type of MOSFET, i.e. either all PMOS transistors or all NMOS transistors, to implement the circuit. As a result, the manufacturing process of the dynamic shift register becomes easier and the throughput is thereby enhanced. In addition, compared to the prior art shift register having CMOS architecture, the dynamic shift register disclosed in the present invention can be implemented by fewer transistors, which reduces the production cost greatly. The horizontal shift register (HSR) circuit, implemented by the claimed dynamic shift register, benefits from the aforementioned advantages.

These and other objectives of the present invention will no doubt become obvious to those of ordinary skill in the art after

DETAILED DESCRIPTION

Figure 1:
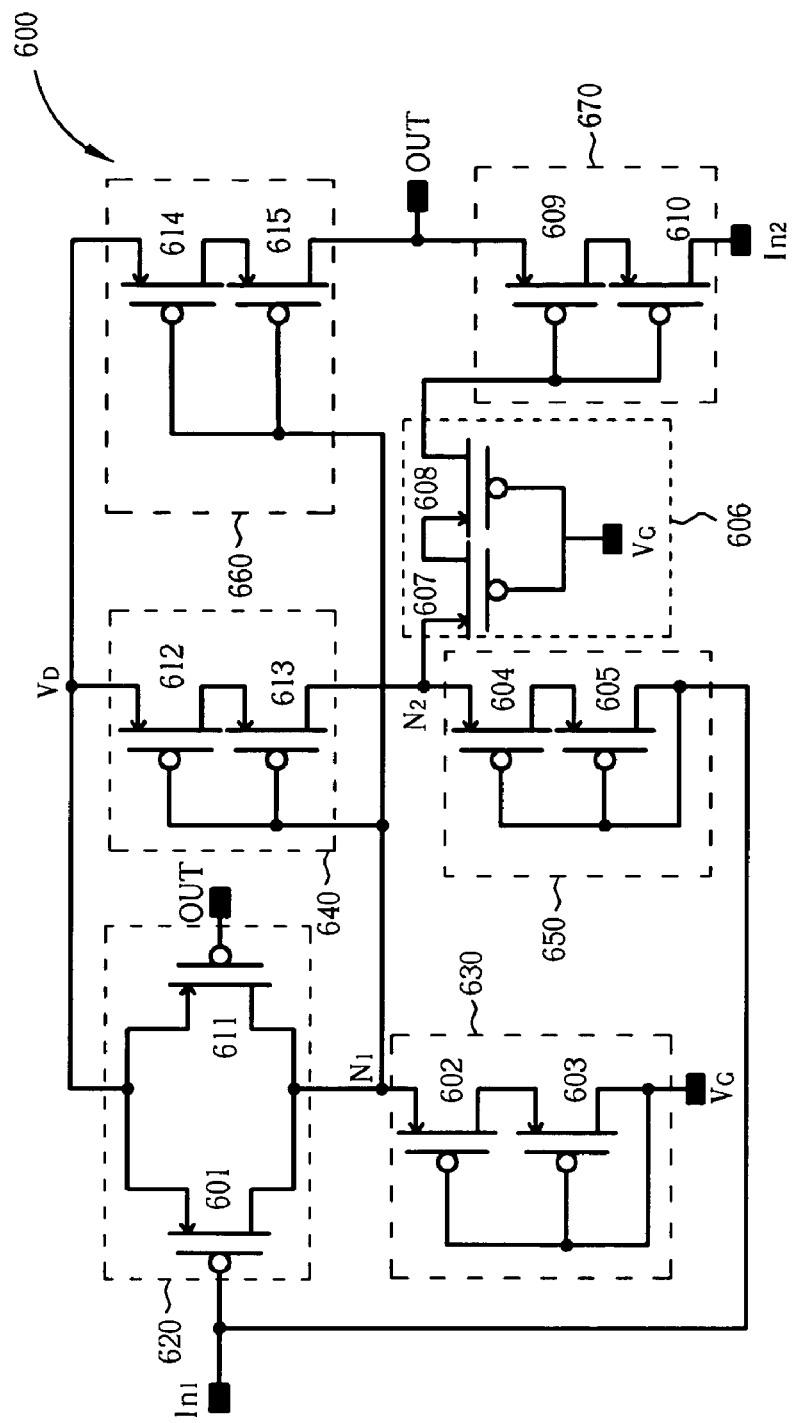
FIG. 1 shows the inner circuit of a dynamic shift register according to an embodiment of the present invention.
Figure 2:
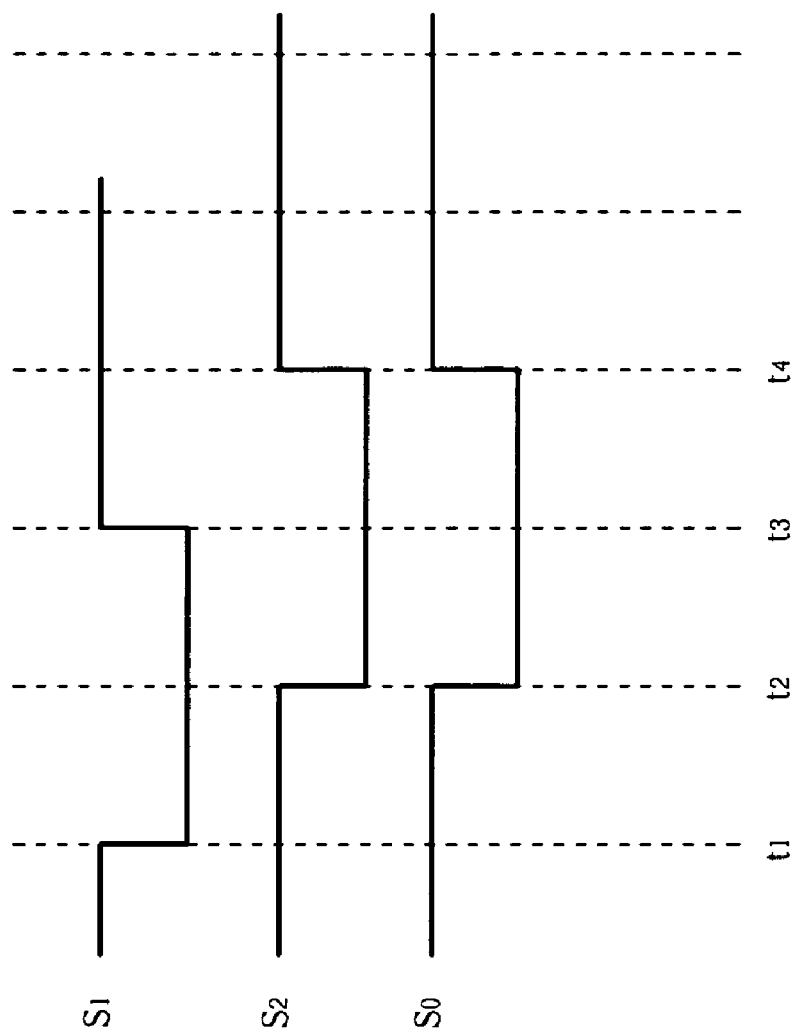
FIG. 2 shows the waveforms of the input signals and the output signal of the dynamic shift register shown in FIG. 1.

Please refer to FIG. 1. FIG. 1 shows the inner circuit of a dynamic shift register according to an embodiment of the present invention. The dynamic shift register 600 receives an input signal $S_1$ at the input terminal $In_1$ that is coupled to the gate of a P-MOSFET 601, which forms a part of the first switching circuit 620. The waveform of the input signal $S_1$ that controls the P-MOSFET 601 is shown in FIG. 2. Referring to both FIGS. 1 and 2, the P-MOSFET 601 is turned on when the input signal $S_1$ switches from a high level (i.e., logic high '1') to a low level (i.e., logic low '0') at time $t_1$. Before the P-MOSFET 601 is turned on, the voltage level at the node $N_1$ is pulled down by a level adjusting circuit 630. In this embodiment, the level adjusting circuit 630 includes two P-MOSFETs 602 and 603, which are connected in series and both being controlled by a relative low voltage $V_G$. The fact that the two P-MOSFETs 602 and 603 are always on leads to a low voltage level $V_G$ at the node $N_1$ whenever the first switching circuit 620 is switched off. In other words, before the input signal $S_1$ switches from a high level to a low level at time ti, the voltage level at the node $N_1$ is equal to $V_G$. Moreover, the aspect ratio of the P-MOSFET 601 is designed to be larger than the aspect ratio of the P-MOSFET 602 and the P-MOSFET 603. Therefore, the P-MOSFET 601 has a larger driving current than either the P-MOSFET 602 or the P-MOSFET 603. As a result, at time $t_1$ when the P-MOSFET 601 is turned on, the first switching circuit 620 is switched on, and the voltage level at the node $N_1$ is pulled up to a voltage level of $V_D$, which is higher than $V_G$.

As shown in FIG. 1, the third switching circuit 650 includes two P-MOSFETs 604 and 605, which are connected in series and both being controlled by the input signal $S_1$. Therefore, after the input signal $S_1$ switches from a high level to a low level, the third switching circuit 650 is turned on such that the input signal $S_1$ passes through the two P-MOSFETs 604 and 605 to the node $N_2$, causing the voltage level at the node $N_2$ be equal to the voltage level of the input signal $S_1$. The voltage level at node $N_2$ then passes through a normally-on switch gate 606 that consists of two P-MOSFETs 607 and 608 with gates coupled to the low voltage $V_G$. After passing through the normally-on switch gate 606, the voltage level at node $N_2$ is received by a fifth switching circuit 670 having two P-MOSFETs 609 and 610 connected in series between an output terminal OUT and a second input terminal $In_2$. The fifth switching circuit 670 is turned on due to the voltage level at Node $N_2$. The second input terminal $In_2$ receives a second input signal $S_2$ whose waveform is shown in FIG. 2. It is apparent that while the voltage level of the input signal $S_1$ is low, both P-MOSFETs 604 and 605 are turned on, letting the input signal $S_1$ pass through these two P-MOSFETs 604 and 605 and the normally-on switch gate 606, to the P-MOSFETs 609 and 610. In other words, while the first input signal $S_1$ is at low voltage level, these two P-MOSFETs 609 and 610 are turned on, letting the second input signal $S_2$ pass to the output terminal OUT. Referring to FIG. 2, within the interval between time $t_1$ and $t_3$ when the first input signal $S_1$ is at a low voltage level, the second input signal $S_2$ received at the second input terminal $In_2$ passes directly to the output terminal OUT, so the output signal $S_0$ is equal to the second input signal $S_2$.

Referring back to FIG. 1, the output terminal OUT is further coupled to a gate terminal of a P-MOSFET 611, which forms another part of the first switching circuit 620. The P-MOSFET 611 is connected in parallel with the P-MOSFET 601 and has a source coupled to the voltage level $V_D$ and a drain coupled to the node $N_1$. The P-MOSFET 611 is being controlled by the output signal $S_0$, and therefore as long as the output signal $S_0$ is at a low voltage level, the P-MOSFET 611 will be turned on. Namely, the P-MOSFET 611 forms a feedback path for the output signal $S_0$. If there were no such P-MOSFET 611, the voltage at the node $N_1$ would become low after the P-MOSFET 601 is turned off, i.e., after the voltage level of the first input signal $S_1$ has a voltage level transition from low to high at time $t_3$, the voltage level at the node $N_1$ would be pulled down to the voltage $V_G$. However, due to the existence of the additional P-MOSFET 611, the voltage level at the node $N_1$ will remain at a high level after time $t_3$ when P-MOSFET 611 is still turned on by the output signal $S_0$. Referring to FIG. 2 at time $t_3$, although the first input signal $S_1$ transits form a low level to a high level, the second input signal $S_2$ is still at a low level. Afterward, the P-MOSFET 601 is turned off, however, the P-MOSFET 611 is still turned on. The voltage level at the node $N_1$ is still high such that the two P-MOSFETs 612 and 613 that form a second switching circuit 640 and are being controlled by the voltage level at the node $N_1$ maintain an off status. On the other hand, after time $t_3$ when the voltage level of the first input signal $S_1$ transits from low to high, the two P-MOSFETs 604 and 605 are turned off. Accordingly, since the voltage level at the floating node $N_2$ is not determined by any voltage level, the voltage level at the node $N_2$ maintains at a low which is the same state as before time $t_3$. As a result, the P-MOSFETs 609 and 610 are still on allowing the second input signal $S_2$ to pass to the output terminal OUT.

When the voltage level of the second input signal $S_2$ transits from low to high, the state of the circuit of the dynamic shift register 600 is changed. At time $t_4$, the voltage level of the second input signal $S_2$ has a level transition from low to high, and this causes the P-MOSFET 611 to turn off. Accordingly, since the P-MOSFETs 601 and 611 both turn off, the first switching circuit 620 is switched off, and the voltage level at the node $N_1$ is pulled down to the voltage $V_G$ by the P-MOSFETs 602 and 603. After the voltage at the node $N_1$ turns form high to low, the P-MOSFETs 612, 613, 614, and 615, all of which are being controlled by the voltage level at the node $N_1$, turn on. In this embodiment, the two P-MOSFETs 614 and 615 form a fourth switching circuit 660. Thus, the voltage level at the node $N_2$ is pulled up to the high voltage $V_D$. The high voltage level at the node $N_2$ turns off the P-MOSFETs 609 and 610; meanwhile, the low voltage level at the node $N_1$ turns on the P-MOSFETs 614 and 615, letting the voltage level $V_D$ pass to the output terminal OUT. As a result, after time $t_4$ the voltage level of the output signal $S_0$ is kept high if there is no further level transition of the first input signal $S_1$.

Briefly summarized, before the first input signal $S_1$ has a transition from high to low, the voltage level of the output signal $S_O$ is kept high due to the switched-on fourth switching circuit 660 and the switched-off fifth switching circuit 670. However, as the first input signal $S_1$ has a transition from high to low, the voltage level of the output signal $S_O$ is allowed to be changed by the input signal $S_2$ because of the switched-off fourth switching circuit 660 and the switched-on fifth switching circuit 670. As shown in FIG. 2, the input signal $S_2$ has a transition from high to low to therefore make the voltage level of the output signal $S_O$ transit from high to low. Afterward, the voltage level of the output signal $S_O$ follows that of the input signal $S_2$ and remains at low even though the input signal $S_1$ has a transition from low to high. When the input signal $S_2$ has a transition from low to high, the voltage level of the output signal $S_O$ becomes high, and then the switched-on fourth switching circuit 660 and the switched-off fifth switching circuit 670 make the voltage level of the output signal $S_O$ kept high.

The normally-on switch gate 606 comprises two P-MOSFETs 607 and 608, which are connected in series. The source terminal of the P-MOSFET 607 is connected to the node $N_2$, and the drain terminal of the P-MOSFET 608 is connected to the gates of P-MOSFETs 609 and 610.

The gates of P-MOSFETs 607 and 608 are both connected to the low voltage level $V_G$ such that the both P-MOSFETs 607 and 608 are normally on. The main function of the normally-on switch gate 606 is to prevent the voltage level at the node $N_2$ from being further pulled down when the second input signal $S_2$ has a level transition from high to low. In general, the high level of the second input signal $S_2$ is about 12V, and the low level of the second input signal $S_2$ is about −6V. Thus, when the voltage level of the second input signal $S_2$ transits from high to low, there is a severe voltage drop of about 18V. If the normally-on switch gate 606 does not exist, the voltage level at the node $N_2$ will be severely affected by a voltage drop of 18V, which imposes undesired voltage stress to transistors and may lead to disorder in the circuit. Therefore, the normally-on switch gate 606 plays an important role in the circuit of the dynamic shift register 600.

All MOSFETs utilized in the above-mentioned embodiment are of P-type, i.e., P-MOSFETs. However, the dynamic shift register 600 can be implemented by a circuit where the MOSFETs utilized are all of N-type. When utilizing the N-type circuit, the input signals and supply voltages are needed to be modified accordingly. For example, the waveforms of the input signals $S_1$, $S_2$ are inverted. Since these modifications are well-known to those skilled in this art, further description is omitted here for brevity. However, both cases result in an easy fabrication process, and the throughput is therefore enhanced. Furthermore, compared to the prior art shift register, for example, the shift register of U.S. Pat. No. 6,157,228, the dynamic shift register 600 is implemented by fewer transistors, which reduces the production cost greatly.

Figure 3:
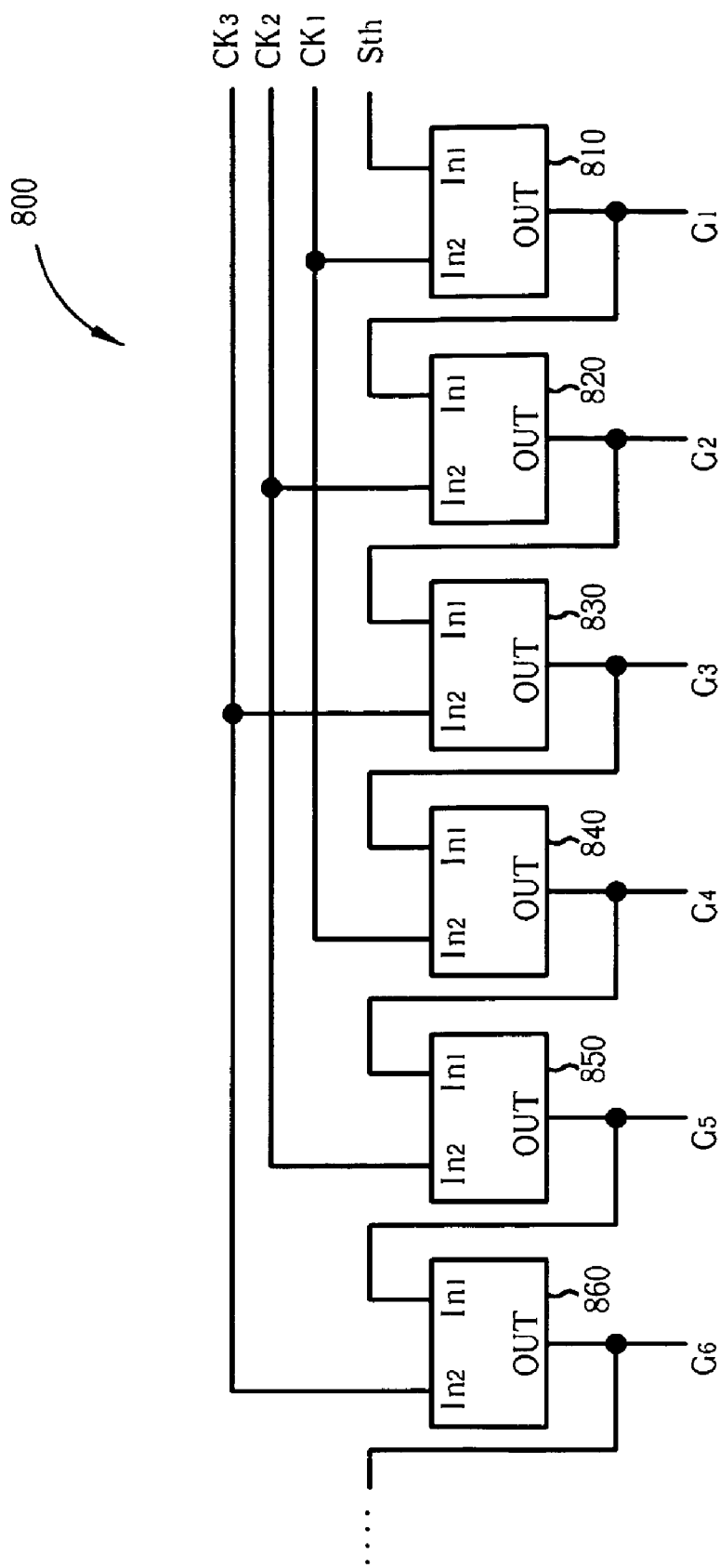
FIG. 3 is a horizontal shift register of the present invention.

Here is another objective of the present invention to provide a horizontal shift register (HSR) circuit for generating overlapped output signals. We utilize the dynamic shift registers 600 shown in FIG. 1 to implement the HSR. Please refer to FIG. 3. FIG. 3 shows an HSR with dynamic shift registers connected in series. The HSR 800 has six dynamic shift registers 810, 820, 830, 840, 850, and 860. These six dynamic shift registers merely serve an exemplary embodiment and are not intended to limit the present invention. In other words, the number of dynamic shift registers implemented in a HSR depends on design requirements. The inner circuits of these six dynamic shift registers 810, 820, 830, 840, 850, and 860 are all the same and are shown in FIG. 1. The initial dynamic shift register, i.e., the dynamic shift register 810, has a first input terminal In, for receiving an input signal $S_{th}$, where the input signal $S_{th}$ serves as a start-up signal of the HSR. As to other dynamic shift registers 820, 830, 840, 850, and 860, each has an input terminal In, connected to output terminal of the preceding dynamic shift register. Each of these six dynamic shift registers 810, 820, 830, 840, 850, and 860 also has a second input $In_2$ for receiving a clock signal. As shown in FIG. 3, the dynamic shift registers 810 and 840 are receiving the clock signal $CK_1$, the dynamic shift registers 820 and 850 receiving the clock signal $CK_2$, and the dynamic shift registers 830 and 860 are receiving the clock signal $CK_3$.

Figure 4:
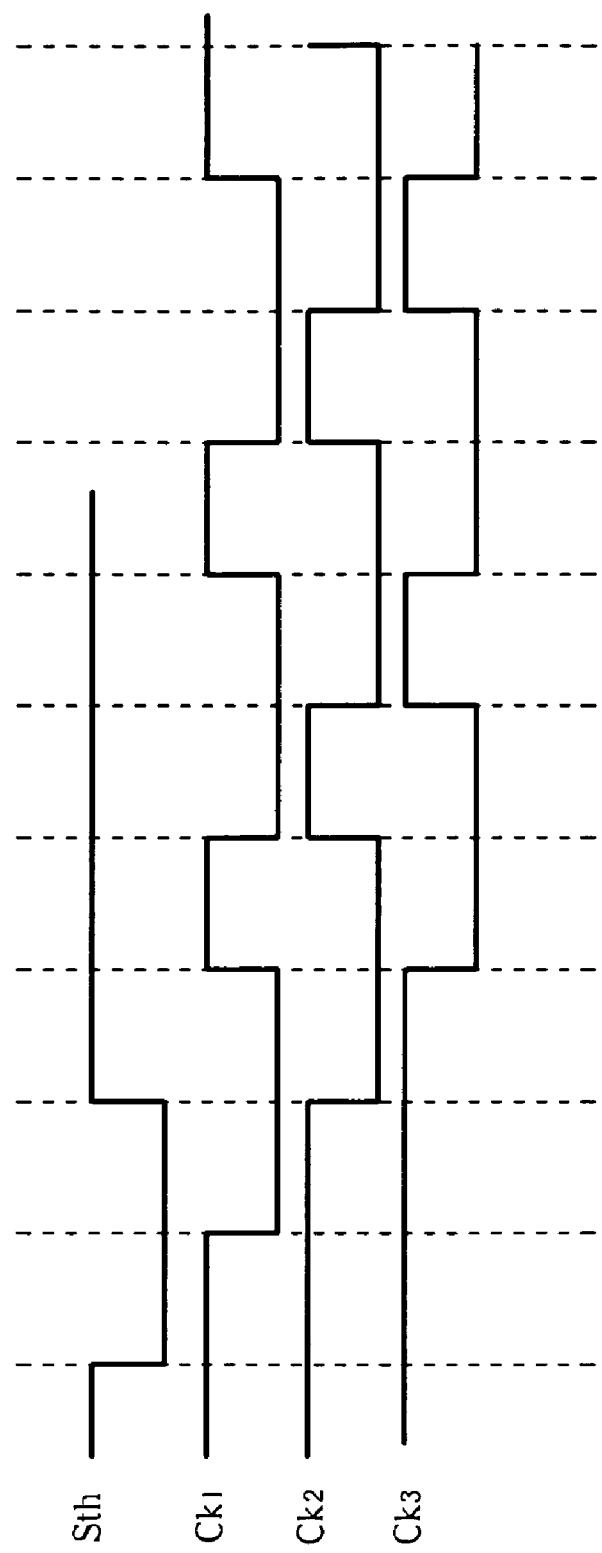
FIG. 4 shows the waveforms of the input signal $S_{th}$ and the clock signals $CK_1, CK_2, CK_3$ of the horizontal shift register of the present invention.
Figure 5:
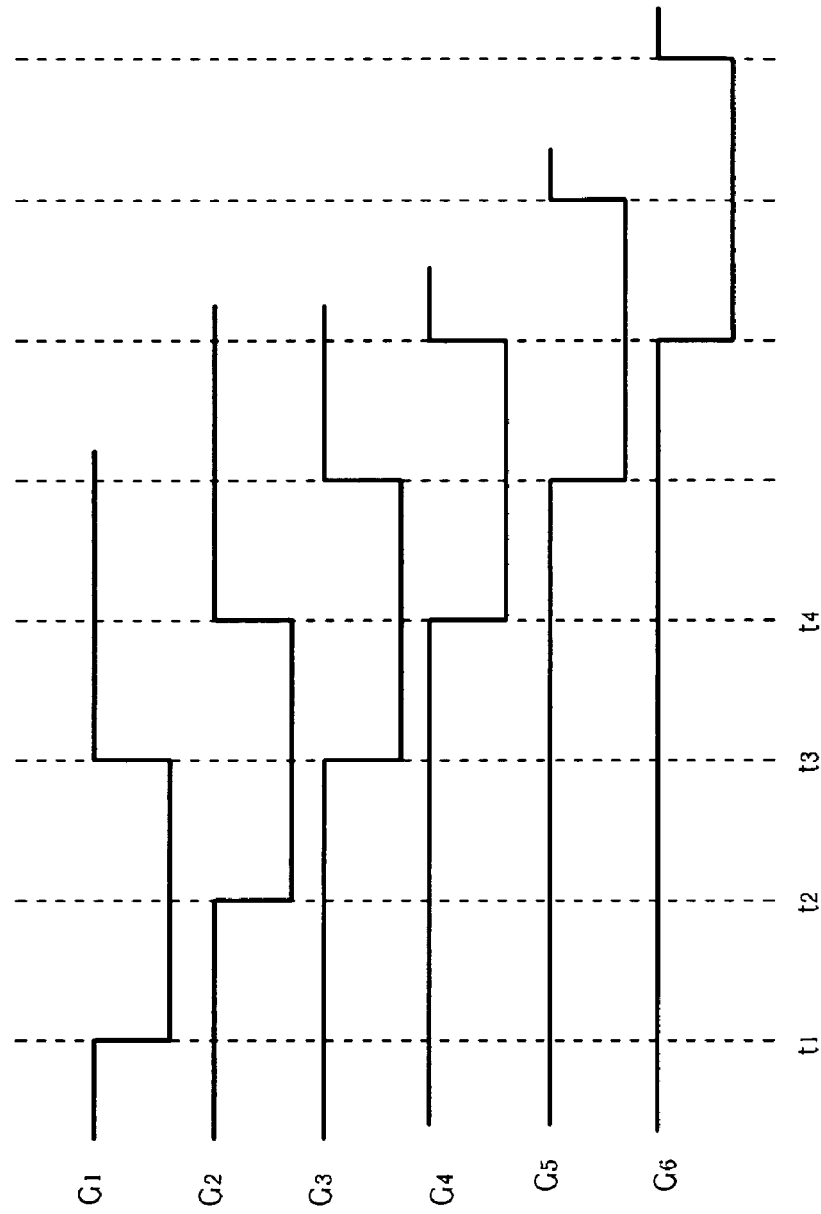
FIG. 5 shows the waveforms of the output signals generated by the HSR shown in FIG. 3.

The waveforms of the input signal $S_{th}$, and the clock signals $CK_1$, $CK_2$, $CK_3$ are shown in FIG. 4. Based on the aforementioned analysis of each dynamic shift register, each dynamic shift register 81 0, 820, 830, 840, 850, and 860 generates its own output signal named respectively from $G_1$ through $G_6$, and the output signals $G_1$-$G_6$ of the cascaded dynamic shift registers 810, 820, 830, 840, 850, and 860 are allowed to be changed after the start-up signal (i.e., the input signal $S_{th}$) has a level transition from high to low; otherwise, the output signals $G_1$-$G_6$ are kept at high. The waveforms of these six output signals $G_1$-$G_6$ are shown in FIG. 5. As a result, desired overlapped output signals are generated through the circuit configuration shown in FIG. 3.

Figure 6:
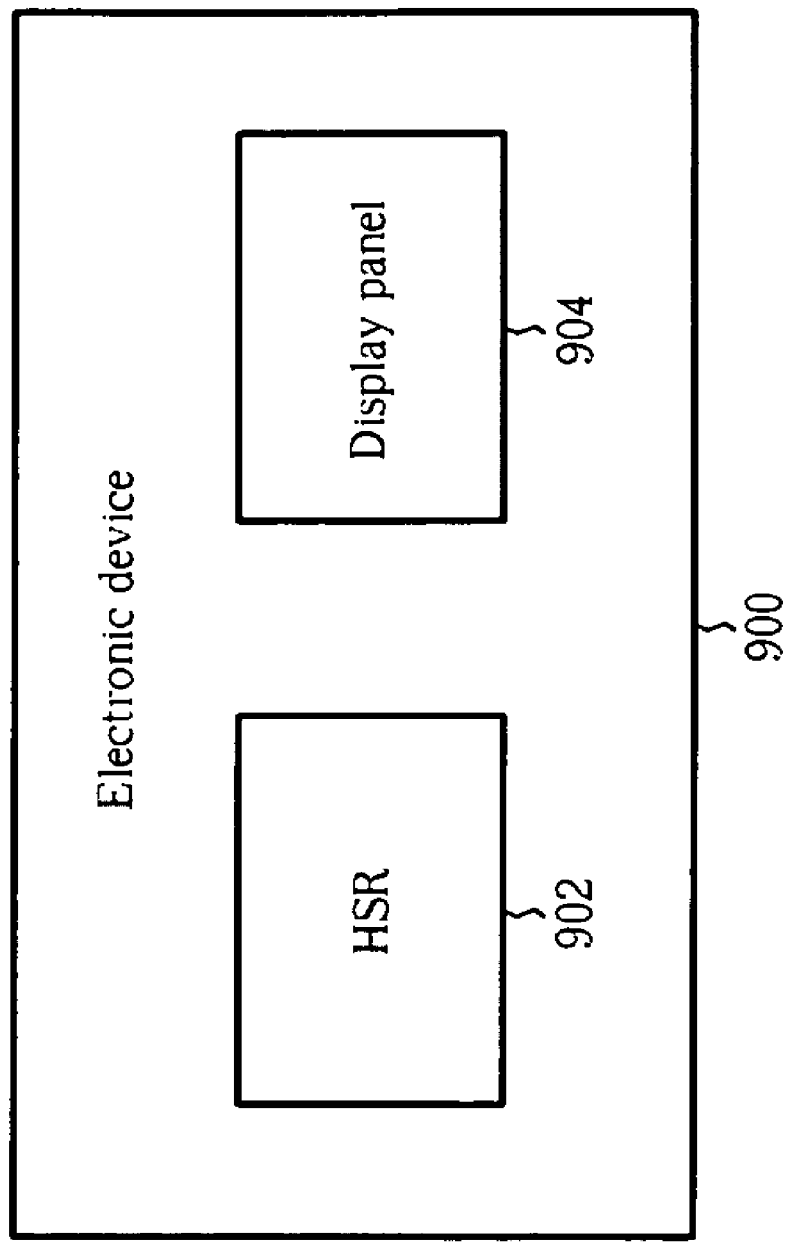
FIG. 6 shows a system capable of displaying images according to an embodiment of the present invention.

Please refer to FIG. 6. FIG. 6 shows a system capable of displaying images according to an embodiment of the present invention. In this embodiment, the system is implemented as an electronic device 900. As shown in FIG. 6, the electronic device 900 includes an HSR 902 and a display panel 904 (e.g., an LCD panel), where the HSR 902 is part of a controller for driving the display panel 904 to display images. It should be noted that the HSR 902 has the aforementioned circuit architecture shown in FIG. 3, and further description is omitted for brevity. In addition, the electronic device 900 can be a mobile phone, digital camera, PDA (personal data assistant), notebook computer, desktop computer, television, car display, or portable DVD player, for example.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A system for displaying images, comprising:
a dynamic shift register comprising:
a first switching circuit, coupled to a first input terminal of the dynamic shift register, an output terminal of the dynamic shift register, a first supply voltage and a first node, and operative to control if the first supply voltage is transmitted to the first node according to a first input signal received by the first input terminal and an output signal outputted from the output terminal;
a level adjusting circuit, coupled to and located between the first node and a second supply voltage, wherein when the first switching circuit is switched off, the level adjusting circuit is capable of driving a voltage level of the first node toward the second supply voltage;
a second switching circuit, coupled to the first node, the first supply voltage, and a second node, and operative to control if the first supply voltage is transmitted to the second node according to the voltage level of the first node;
a third switching circuit, coupled to the first input signal and the second node, and operative to control if the first input signal is transmitted to the second node according to the first input signal;
a fourth switching circuit, coupled to the first node, the first supply voltage, and the output terminal, and operative to control if the first supply voltage is transmitted to the output terminal according to the voltage level of the first node; and a fifth switching circuit, coupled to a second input terminal of the dynamic shift register, the second node, and the output terminal, and operative to control if the second input signal received by the second input terminal is transmitted to the output terminal according to a voltage level of the second node.

2. The system of claim 1, wherein the dynamic shift register further comprises:

a switch gate, coupled to and located between the second node and the fifth switching circuit, and operative to prevent the voltage level of the second node from being affected by the second input signal when the second input signal has a level transition.

3. The system of claim 2, wherein the switch gate comprises at least a MOSFET having a first terminal coupled to the second node, a second terminal coupled to the fifth switching circuit, and a gate coupled to the second supply voltage.

4. The system of claim 1, wherein the first switching circuit comprises a first switching unit being controlled by the first input signal and a second switching unit being controlled by the output signal, the first and second switching units are connected in parallel, when the first input signal or the output signal is at a first logic level, the first switching circuit is switched on, and when both the first input signal and the output signal are at a second logic level, the first switching circuit is switched off.

5. The system of claim 4, wherein the first switching unit comprises a MOSFET having a first terminal coupled to the first supply voltage, a second terminal coupled to the first node, and a gate coupled to the first input terminal; and the second switching unit comprises a MOSFET having a first terminal coupled to the first supply voltage, a second terminal coupled to the first node, and a gate coupled to the output terminal.

6. The system of claim 5, wherein the level adjusting circuit comprises at least a MOSFET having a first terminal coupled to the first node, a second terminal coupled to the second supply voltage, and a gate coupled to the second supply voltage.

7. The system of claim 6, wherein the aspect ratio of each of the first and second switching units is greater than the aspect ratio of the level adjusting circuit such that the driving current provided by the first switching circuit is larger than the driving current provided by the level adjusting circuit.

8. The system of claim 1, wherein the second switching circuit comprises at least a MOSFET having a first terminal coupled to the first supply voltage, a second terminal coupled to the second node, and a gate coupled to the first node.

9. The system of claim 1, wherein the third switching circuit comprises at least a MOSFET having a first terminal coupled to the first input terminal, a second terminal coupled to the second node, and a gate coupled to the first input terminal.

10. The system of claim 1, wherein the fourth switching circuit comprises at least a MOSFET having a first terminal coupled to the first supply voltage, a second terminal coupled to the output terminal, and a gate coupled to the first node.

11. The system of claim 1, wherein the fifth switching circuit comprises at least a MOSFET having a first terminal coupled to the output terminal, a second terminal coupled to the second input terminal, and a gate coupled to the second node.

12. The system of claim 1, further comprising a display panel, wherein the dynamic shift register is coupled to the display panel and operative to drive the display panel.

13. The system of claim 12, further comprising an electronic device, wherein the electronic device comprises the display panel and the dynamic shift register.

14. The system of claim 13, wherein the electronic device is a mobile phone, digital camera, PDA (personal data assistant), notebook computer, desktop computer, television, car display, or portable DVD player.

15. A system for displaying images comprising:

a horizontal shift register (HSR) circuit operative to generate overlapped output signals, the HSR circuit comprising:

a plurality of dynamic shift registers connected in a series, each dynamic shift register comprising:

a first switching circuit, coupled to a first input terminal of the dynamic shift register, an output terminal of the dynamic shift register, a first supply voltage and a first node, and operative to control if the first supply voltage is transmitted to the first node according to a first input signal received by the first input terminal and an output signal outputted from the output terminal;

a level adjusting circuit, coupled to and located between the first node and a second supply voltage, wherein when the first switching circuit is switched off, the level adjusting circuit is capable of driving a voltage level of the first node toward the second supply voltage;

a second switching circuit, coupled to the first node, the first supply voltage, and a second node, and operative to control if the first supply voltage is transmitted to the second node according to the voltage level of the first node;

a third switching circuit, coupled to the first input signal and the second node, and operative to control if the first input signal is transmitted to the second node according to the first input signal;

a fourth switching circuit, coupled to the first node, the first supply voltage, and the output terminal, and operative to control if the first supply voltage is transmitted to the output terminal according to the voltage level of the first node; and a fifth switching circuit, coupled to a second input terminal of the dynamic shift register, the second node, and the output terminal, and operative to control if the second input signal received by the second input terminal is transmitted to the output terminal according to a voltage level of the second node;

wherein each dynamic shift register has the first input terminal coupled to an output terminal of a preceding dynamic shift register except an initial dynamic shift register.

16. The system of claim 15, further comprising a display panel, wherein the HSR circuit is coupled to the display panel and operative to drive the display panel.

17. The system of claim 16, further comprising an electronic device, wherein the electronic device comprises the display panel and the HSR circuit.

18. The system of claim 17, wherein the electronic device is a mobile phone, digital camera, PDA (personal data assistant), notebook computer, desktop computer, television, car display, or portable DVD player.

* * * * *